United States Patent [19]
Lee

[11] Patent Number: 5,696,720
[45] Date of Patent: Dec. 9, 1997

[54] SEMICONDUCTOR MEMORY DEVICE

[75] Inventor: Jae Jin Lee, Kyoungki-do, Rep. of Korea

[73] Assignee: Hyundai Electronics Industries Co., Ltd., Kyoungki-do, Rep. of Korea

[21] Appl. No.: 777,199

[22] Filed: Dec. 27, 1996

[30] Foreign Application Priority Data

Dec. 29, 1995 [KR] Rep. of Korea ............ 95-66033

[51] Int. Cl.$^6$ ............................................. G11C 7/00
[52] U.S. Cl. .......................... 365/189.05; 365/189.01; 365/189.08; 365/230.08
[58] Field of Search ............... 365/189.05, 189.01, 365/230.08, 189.08

[56] References Cited

U.S. PATENT DOCUMENTS

| | | | |
|---|---|---|---|
| 4,562,555 | 12/1985 | Ouchi et al. | 365/233 |
| 5,200,925 | 4/1993 | Morooka | 365/219 |
| 5,500,820 | 3/1996 | Nakaoka | 365/189.01 |
| 5,530,676 | 6/1996 | Sullivan et al. | 365/227 |
| 5,553,024 | 9/1996 | Furuyama | 365/189.05 |
| 5,604,714 | 2/1997 | Manning et al. | 365/230.08 |

*Primary Examiner*—David C. Nelms
*Assistant Examiner*—Hien Nguyen
*Attorney, Agent, or Firm*—Reid & Priest LLP

[57] ABSTRACT

A semiconductor memory device comprising a plurality of memory cells for storing data therein, a data input buffer circuit for buffering an input data signal, a data register circuit for storing the input data signal therein, a switching element for transferring the input data signal to the data register circuit, a register set control logic unit for controlling the switching element, a register set decoding circuit for decoding an output signal from the register set control logic unit and a first address signal, a write data drive circuit for transferring an output data signal from the data input buffer circuit or the data register circuit to a selected one of the memory cells, a first data transfer element for transferring the output data signal from the data input buffer circuit to the write data drive circuit, a second data transfer element for transferring the output data signal from the data register circuit to the write data drive circuit, a data transfer control circuit for generating first and second control signals to control the first and second data transfer element, respectively, and a data register output control circuit for decoding the second control signal from the data transfer control circuit and a second address signal.

14 Claims, 4 Drawing Sheets

SEMICONDUCTOR MEMORY DEVICE

BACKGROUND OF THE INVENTION

1. Field of the Invention

The present invention relates in general to semiconductor memory devices, and more particularly to a semiconductor memory device in which a repetitive data signal is stored in a register to be used in a write operation mode, so that a write operation can be performed with no external data input.

2. Description of the Prior Art

FIG. 1 is a partial block diagram illustrating the construction of a conventional dynamic random access memory (referred to hereinafter as DRAM) for performing a write operation. As shown in this drawing, the conventional DRAM comprises a plurality of memory cell blocks 102 each including a plurality of memory cells for storing data therein, a data input buffer circuit 100 for buffering an input data signal, a data input control circuit 108 for generating a control signal to control the data input buffer circuit 100, and a write data drive circuit 101 for transferring an output data signal from the data input buffer circuit 100 to one of the memory cells corresponding to an input address signal.

In a write operation mode, if data signals are successively inputted through an external data pin, they are applied to the data input buffer circuit 100 through a node N1. The data input buffer circuit 100 buffers the input data signals in response to the control signal from the data input control circuit 108 and transfers the buffered data signals to the write data drive circuit 101 through a write data bus line N2. The write data drive circuit 101 is driven in response to a write enable signal to transfer the output data signals from the data input buffer circuit 100 to the memory cells corresponding to input address signals.

However, in the write operation mode, the above-mentioned conventional DRAM has to input one data signal at every clock to successively store the input data signals in the corresponding memory cells. For this reason, a data drive circuit must be operated at every clock to generate each data signal, resulting in an increase in power consumption and a reduction in operation speed.

SUMMARY OF THE INVENTION

Therefore, the present invention has been made in view of the above problem, and it is an object of the present invention to provide a semiconductor memory device in which, when data signals are successively inputted, a repetitive data signal thereof is stored in a register to be used in a write operation mode, so that a write operation can be performed with no external data input.

In accordance with the present invention, the above and other objects can be accomplished by a provision of a semiconductor memory device comprising a plurality of memory cell blocks each including a plurality of memory cells for storing data therein; data input buffer means for buffering an input data signal; data register means for storing the input data signal therein; switching means for transferring the input data signal to the data register means; register set control logic means for controlling the switching means; register set decoding means for decoding an output signal from the register set control logic means and a first address signal to transfer the input data signal to the data register means; write data drive means for transferring an output data signal from the data input buffer means or the data register means to a selected one of the memory cells; first data transfer means for transferring the output data signal from the data input buffer means to the write data drive means; second data transfer means for transferring the output data signal from the data register means to the write data drive means; data transfer control means for generating first and second control signals to control the first and second data transfer means, respectively; and data register output control means for decoding the second control signal from the data transfer control means and a second address signal to transfer the output data signal from the data register means to the write data drive means through the second data transfer means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
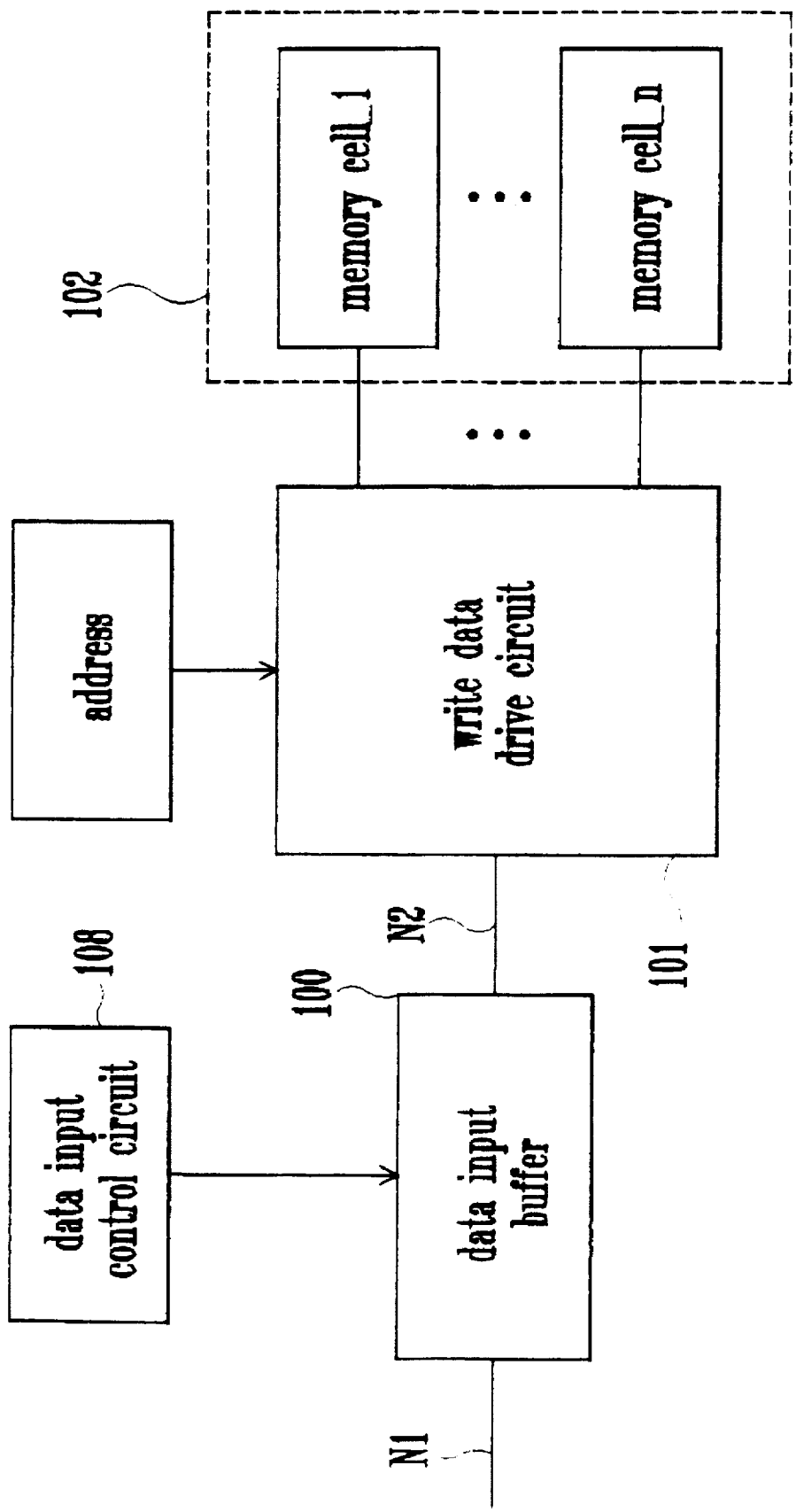
FIG. 1 is a partial block diagram illustrating the construction of a conventional DRAM for performing a write operation.
Figure 2:
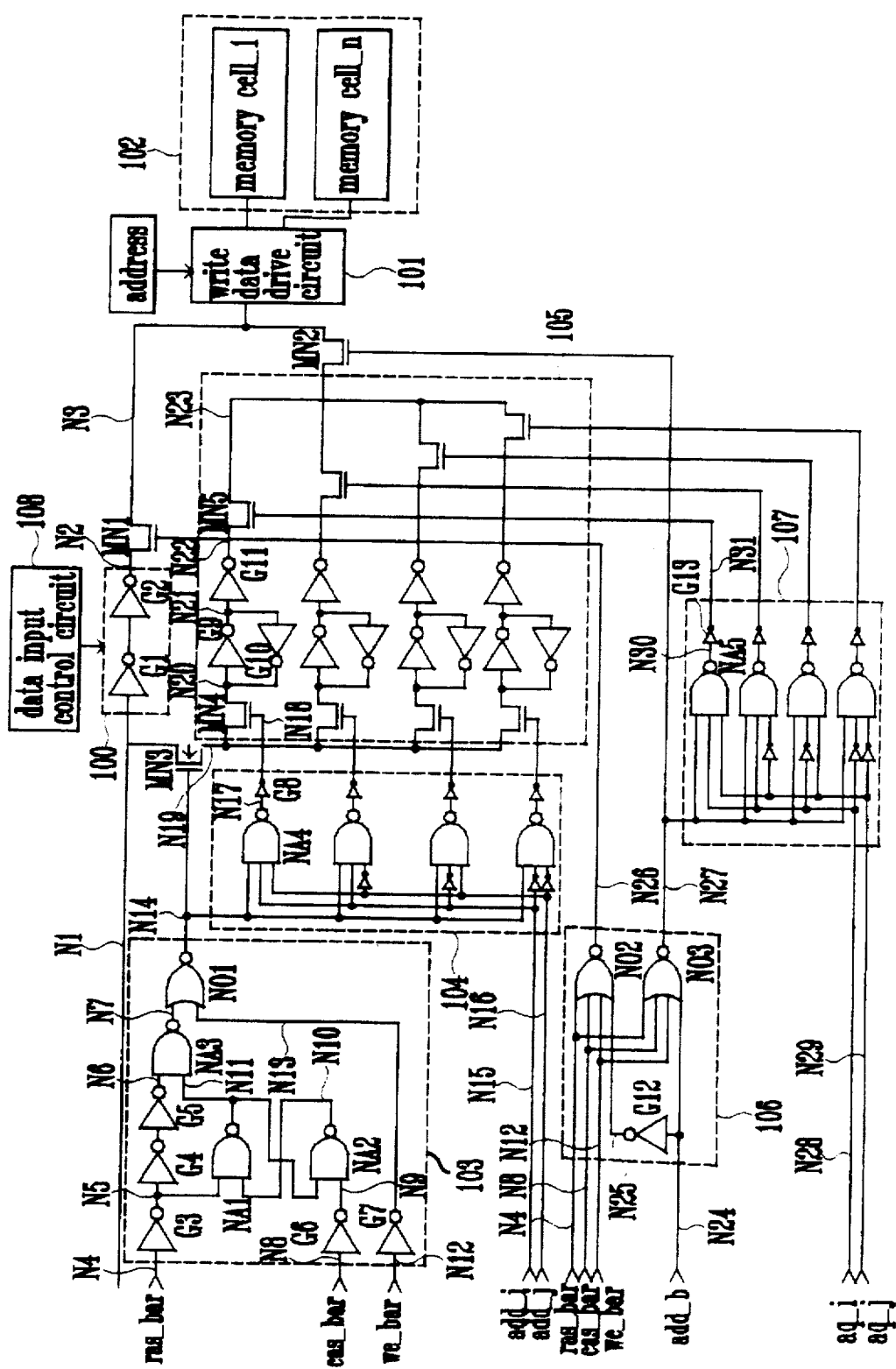
FIG. 2 is a partial circuit diagram illustrating the construction of a DRAM in accordance with an embodiment of the present invention.

FIG. 2 is a partial circuit diagram illustrating the construction of a DRAM in accordance with an embodiment of the present invention. As shown in this drawing, the DRAM comprises a plurality of memory cell blocks 102 each including a plurality of memory cells for storing data therein, a data input buffer circuit 100 for buffering an input data signal, a data input control circuit 108 for generating a control signal to control the data input buffer circuit 100, a data register circuit 105 for storing the input data signal therein, a first switching element MN3 for transferring the input data signal to the data register circuit 105, a register set control logic unit 103 for generating a control signal to control the first switching element MN3, a write data drive circuit 101 for transferring an output data signal from the data input buffer circuit 100 or the data register circuit 105 to a selected one of the memory cells, a first data transfer element MN1 for transferring the output data signal from the data input buffer circuit 100 to the write data drive circuit 101, a second data transfer element MN2 for transferring the output data signal from the data register circuit 105 to the write data drive circuit 101, and a data transfer control circuit 106 for generating control signals to control the first and second data transfer elements MN1 and MN2, respectively.

The data register circuit 105 includes a plurality of data registers each including a latch circuit for temporarily storing the input data signal transferred by the first switching element MN3 therein, a second switching element MN4 for transferring the input data signal transferred by the first switching element MN3 to the latch circuit, and a third switching element MN5 for transferring the input data signal stored in the latch circuit to the second data transfer element MN2.

Further, the DRAM comprises a register set decoder 104 for generating a control signal in response to the control signal from the register set control logic unit 103 and an address signal to control the second switching element MN4 in the data register circuit 105, and a data register output control signal generator 107 for generating a control signal in response to the second data transfer element control signal from the data transfer control circuit 106 and an address signal to control the third switching element MN5 in the data register circuit 105.

The data input buffer circuit 100 includes a plurality of data input buffers each having inverters G1 and G2 connected in series between nodes N1 and N2. Noticeably, the number of data input buffers is in proportion to that of the input data signals. Specifically, when the number of input data signals is n, the number of data input buffers is n, as well.

The first data transfer element MN1 is provided with an NMOS transistor connected between the node N2 and a node N3 and having its gate connected to a node N26. The first switching element MN3 is provided with an NMOS transistor connected between the node N1 and a node N19 and having its gate connected to a node N14.

In the data register circuit 105, the second switching element MN4 is provided with art NMOS transistor connected between the node N19 and a node N20 and having its gate connected to a node N18. The latch circuit includes two inverters G9 and G10 connected in parallel between the node N20 and a node N21 and one inverter G11 connected between the node N21 and a node N22. The third switching element MN5 is provided with an NMOS transistor connected between the node N22 and a node N23 and having its gate connected to a node N31.

The second data transfer element MN2 is provided with art NMOS transistor connected between the node N23 and the node N3 and having its gate connected to a node N27.

The data transfer control circuit 106 includes an inverter G12 for inverting an address signal add_b, a NOR gate NO2 for NORing a row address strobe bar signal/RAS, a column address strobe bar signal/CAS, a write enable signal/we and an output signal from the inverter G12 and outputting the NORed result to the node N26, and a NOR gate NO3 for NORing the row address strobe bar signal/RAS, the column address strobe bar signal/CAS, the write enable signal/we and the address signal add_b and outputting the NORed result to the node N27.

The register set control logic unit 103 includes an input node N4 for inputting the row address strobe bar signal/RAS, an inverter G3 connected between the node N4 and a node N5, inverters G4 and G5 connected in series between the node N5 and a node N6, an input node N8 for inputting the column address strobe bar signal/CAS, an inverter G6 connected between the node N8 and a node N9, and a flip-flop for latching signals at the nodes N5 and N9 and outputting the latched result to a node N11. The flip-flop is provided with two NAND gates NA1 and NA2.

Further, the register set control logic unit 103 includes a NAND gate NA3 for NANDing signals at the nodes N6 and N11 and outputting the NANDed result to a node N7, an input node N12 for inputting the write enable signal/we, an inverter G7 connected between the node N12 and a node N13, and a NOR gate NO1 for NORing signals at the nodes N7 and N13 and outputting the NORed result to the node N14.

The register set decoder 104 includes a plurality of NAND gates NA4 and a plurality of inverters G8. Each NAND gate NA4 is adapted to NAND a signal at the node N14 and an address signal (add_i,add_j) and output the NANDed result to a node N17. Each inverter G8 is connected between the nodes N17 and N18.

The data register output control signal generator 107 includes a plurality of NAND gates NA5 and a plurality of inverters G13. Each NAND gate NA5 is adapted to NAND a signal at the node N27 and an address signal (dq_i,dq_j) and output the NANDed result to a node N30. Each inverter G13 is connected between the nodes N30 and N31.

The operation of the DRAM with the above-mentioned construction in accordance with the preferred embodiment of the present invention will hereinafter be described in detail.

In a write operation mode, if data signals are successively inputted through an external data pin, they are applied to the data input buffer circuit 100 and data register circuit 105 through the input node N1. As mentioned above, the data input buffer circuit 100 includes the same number of data input buffers as that of the input data signals from the input node N1. Similarly, the data register circuit 105 includes the same number of data registers as that of the input data signals from the input node N1. First, the sequential input data signals are buffered by the corresponding data input buffers in the data input buffer circuit 100 and then applied to the write data drive circuit 101 through the first data transfer element MN1 which is turned on by the data transfer control circuit 106. Then, the write data drive circuit 101 transfers the output data signals from the data input buffer circuit 100 to the memory cells corresponding to input address signals to store them in the corresponding memory cells. On the other hand, in the case where an input data signal has the same value as that of a data signal stored in the data register circuit 105, the data transfer control circuit 106 is driven in response to the address signal add b to turn on the second data transfer element MN2 while turning off the first data transfer element MN1. As a result, the write operation is performed on the basis of the data signal stored in the data register circuit 105 with no external data input. In other words, the write operation is performed under the control of the data transfer control circuit 106. At this time, the data transfer control circuit 106 generates the control signals in response to the address signal add_b to control the first and second data transfer elements MN1 and MN2, respectively.

Now, the operation of applying the external address signal to the data register circuit 105 in accordance with the preferred embodiment of the present invention will hereinafter be described in more detail.

When the column address strobe bar signal/CAS is first made active low in logic and the row address strobe bar signal/RAS and write enable signal/we are then simultaneously made active low in logic, the register set control logic unit 103 turns on the first switching element MN3.

If the first switching element MN3 is turned on under the control of the register set control logic unit 103, it transfers the input data signal from the input node N1 to the second switching element MN4 in the data register circuit 105. At this time, the register set decoder 104 controls the second switching element MN4 in response to the output signal (N14) from the register set control logic unit 103 and the address signal (add_i,add_j). Namely, if the output signal (N14) from the register set control logic unit 103 and the address signal (add_i,add_j) are both high in logic, the output signal (N18) from the register set decoder 104 becomes high in logic, thereby causing the second switching element MN4 to be turned on. As a result, the input data signal from the input node N1 is latched by the inverters G9 and G10, which constitute a memory cell.

Then, the data signal latched by the inverters G9 and G10 is transferred to the second data transfer element MN2 through the inverter G11 and third switching element MN5. At this time, the data register output control signal generator 107 controls the third switching element MN5 in response to the address signal (dq_i,dq_j) and a register data enable signal or the second data transfer element control signal (N27) from the data transfer control circuit 106 which controls the second data transfer element MN2. Namely, the data register output control signal generator 107 controls the third switching element MN5 in response to logic states of bits of the address signal (dq_i,dq_j) when the register data enable signal (N27) from the data transfer control circuit 106 is high in logic. If the bits of the address signal (dq_i,dq_j) are both high in logic, the output signal (N31) from the data register output control signal generator 107 becomes high in logic, thereby causing the third switching element MN5 to be turned on. As a result, the data signal stored in the data register circuit 105 is transferred to the second data transfer element MN2.

In the preferred embodiment of the present invention, the data register circuit 105 includes four memory cells, as shown in FIG. 2. As a result, four input data signals from the first switching element MN3 are sequentially stored in the four memory cells, respectively. To this end, the register set decoder 104 includes four NAND gates for decoding two bits of the address signal (add_i, add_j).

Similarly, in order to transfer the four data signals stored in the data register circuit 105 to the second data transfer element MN2, the data register output control signal generator 107 includes four NAND gates for decoding two bits of the address signal (dq_i,dq_j).

Figure 3:
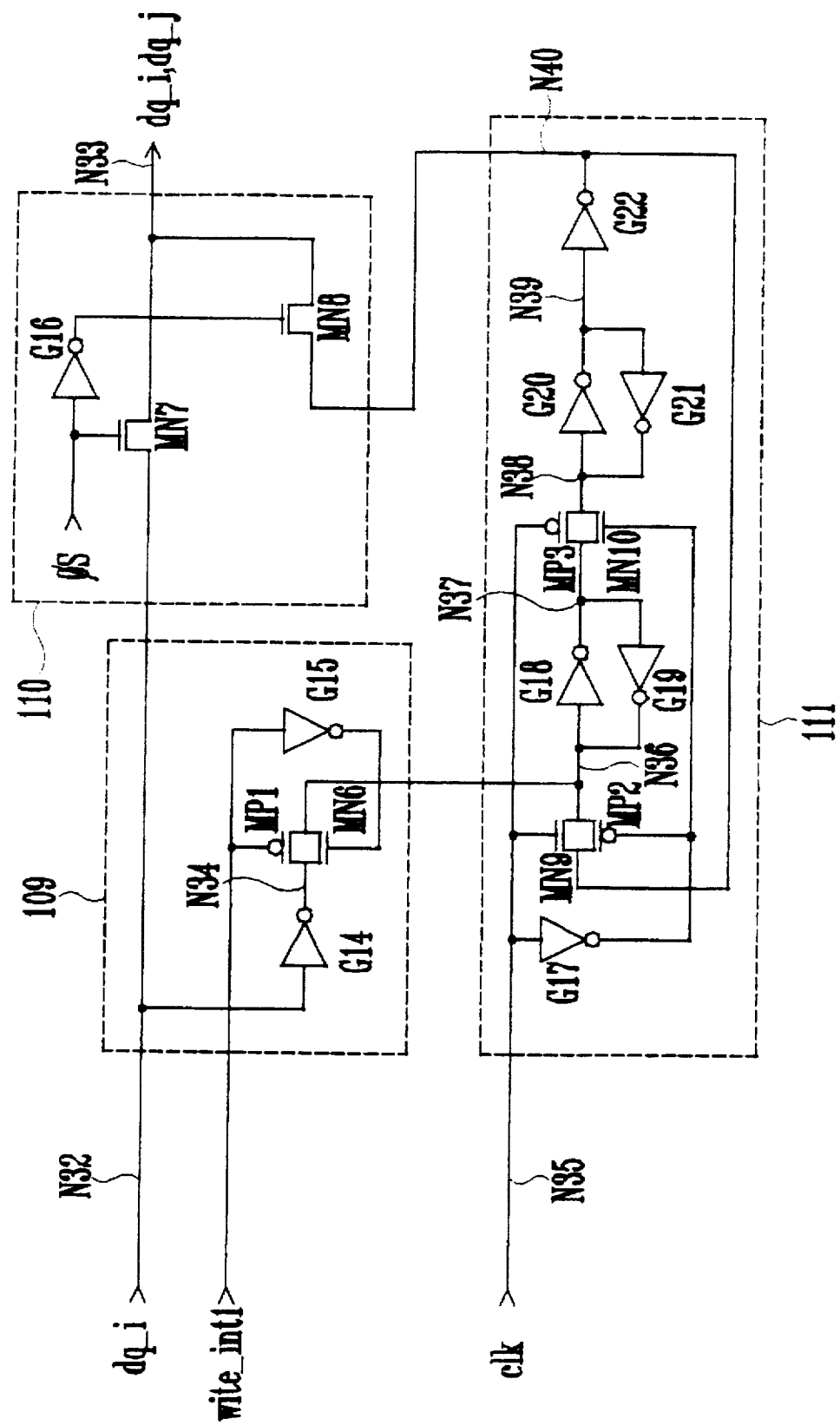
FIG. 3 is a detailed circuit diagram illustrating the construction of a binary counter circuit for generating an address signal in FIG. 2.

FIG. 3 is a detailed circuit diagram illustrating the construction of a binary counter circuit for generating the address signal (dq_i,dq_j) in FIG. 2. As shown in this drawing, the binary counter circuit comprises a counter circuit 111 for generating a sequential address signal in response to an external input address signal dq_i, an address setting circuit 109 for setting the external input address signal dq_i in the counter circuit 111, and a multiplexing circuit 110 for selectively transferring the address signal from the counter circuit 111 and the external input address signal dq_i.

The address setting circuit 109 includes an input node N32 for inputting the external address signal dq_i, an inverter connected between the node N32 and a node N34, and a transfer gate for transferring a signal at the node N34 to a node N36 of the counter circuit 111 in response to a control signal write_int1. The transfer gate is provided with PMOS and NMOS transistors MP1 and MN6.

The counter circuit 111 includes inverters G18 and G19 connected in parallel between the node N36 and a node N37, for latching a signal at the node N36, a transfer gate for transferring a signal at the node N37 to a node N38 in response to a clock signal clk, inverters G20 and G21 connected in parallel between the node N38 and a node N39, for latching a signal at the node N38, and an inverter G22 connected between the node N39 and a node N40. The transfer gate is provided with PMOS and NMOS transistors MP3 and MN10.

The multiplexer circuit 110 includes an NMOS transistor MN7 for transferring a signal at the node N32 to an output node N33 in response to a control signal φS, an inverter G16 for inverting the control signal φS, and an NMOS transistor MN8 for transferring a signal at the node N40 to the output node N33 in response to an output signal from the inverter G16.

The operation of the binary counter circuit with the above-mentioned construction will hereinafter be described in detail.

First, the address setting circuit 109 applies the external input address signal dq_i to the counter circuit 111, which then sequentially generates the subsequent address signal. Then, in the multiplexer circuit 110, in response to the control signal φS, the NMOS transistor MN7 transfers the external input address signal dq_i at the node N32 to the output node N33 or the NMOS transistor MN8 transfers the address signal at the node N40 to the output node N33. At this time, a signal at the output node N33 is the address signal (dq_i,dq_j) which is applied to the data register output control signal generator 107 in FIG. 2.

Figure 4:
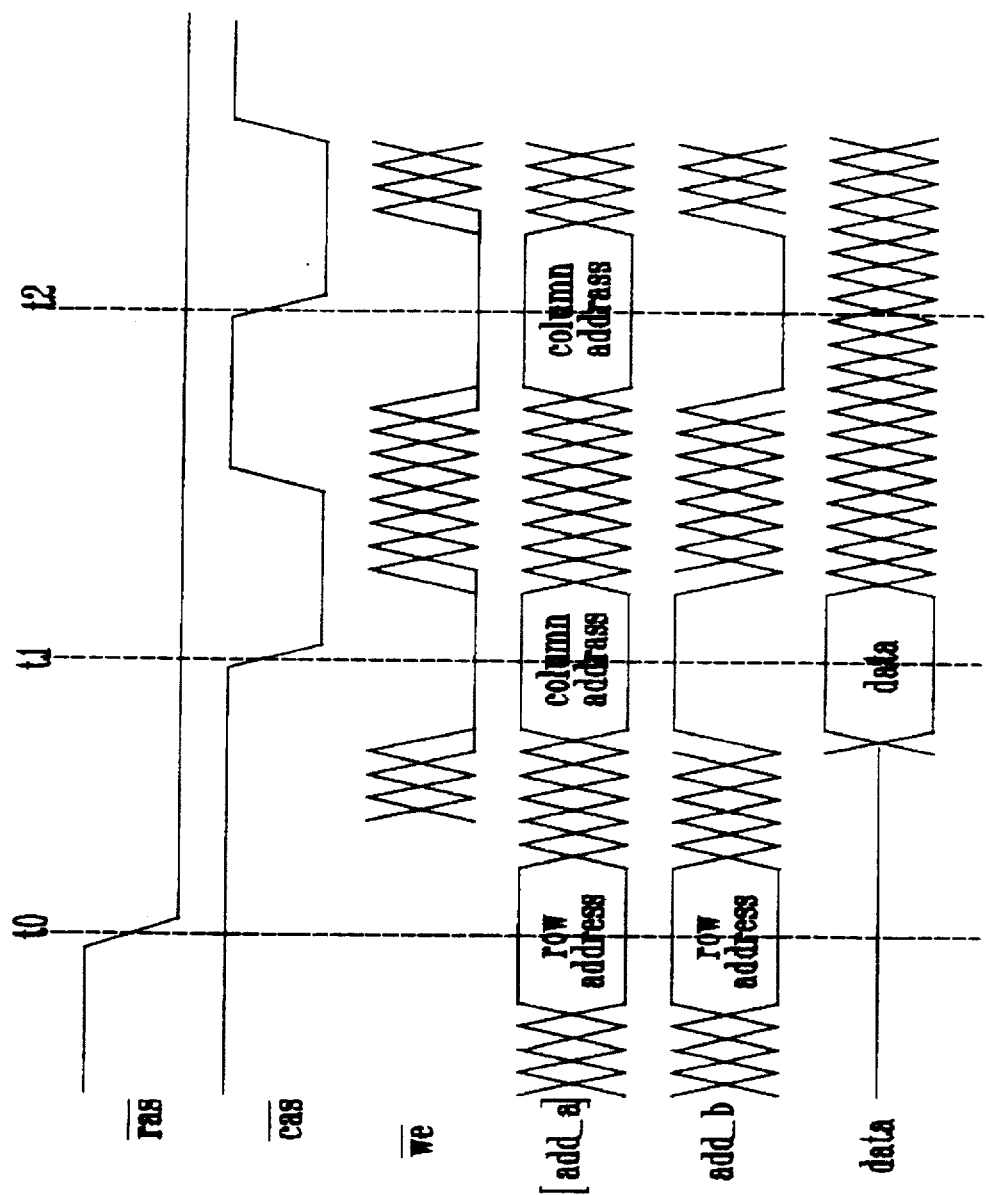
FIG. 4 is a timing diagram illustrating the operation of the DRAM in FIG. 2.

FIG. 4 is a timing diagram illustrating the operation of the DRAM in FIG. 2. In this drawing, the reference character add_a designates an address pin which is used to input both row and column address signals, and the reference character add_b designates an address pin which is used to input only the row address signal. The row address signal is inputted when the row address strobe bar signal/RAS goes from high to low in logic. The column address signal is inputted when the column address strobe bar signal/CAS goes from high to low in logic. When the write enable signal/we goes from high to low in logic, the external input data signal or the data signal stored in the data register circuit 105 is written into the corresponding memory cell.

Also, the address pin add_b is used to determine whether one of the general write operation mode or the write operation mode of the present invention will be performed.

In other words, in the general write operation mode, the address pin add_b enters a don't care state. However, in the write operation mode of the present invention, when a high logic signal is applied to the address pin add_b, the external input data signal is directly written into the memory cell block 102 in FIG. 2. In the case where a low logic signal is applied to the address pin add_b, the data signal stored in the data register circuit 105 is written into the memory cell block 102. These write operations are determined by the data transfer control circuit 106 which is driven in response to the address signal at the address pin add_b.

In FIG. 4, "t0" represents a time point where the row address signal is inputted when the row address strobe bar signal/RAS goes from high to low in logic. "t1" represents a time point where the external input data signal is stored in the memory cell block 102 as the column address signal is applied to the address pin add_a upon the high to low logic transition of the column address strobe bar signal/CAS and a high logic value is applied to the address pin add_b. Also, "t2" represents a time point where the data signal stored in the data register circuit 105 is written into the memory cell block 102 as a low logic value is applied to the address pin add_b in a write enable interval.

In other words, when the address signal at the address pin add_b is at a specific logic state or low logic state under the condition that the write enable signal/we is enabled low in logic, the data signal stored in the data register circuit 105 is written into the memory cell block 102. Alternatively, the data transfer control circuit 106 may be controlled by any other address signal combination to have the same effect.

As is apparent from the above description, according to the present invention, when data signals are successively inputted, a repetitive data signal thereof is stored in the register and then used in the subsequent write operation mode. Therefore, the write operation can be performed with no external data input, resulting in less in power consumption and an increase in operation speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a plurality of memory cell blocks each including a plurality of memory cells for storing data therein;

data input buffer means for buffering an input data signal;

data register means for storing said input data signal therein;

first switching means for transferring said input data signal to said data register means;

register set control logic means for controlling said first switching means;

register set decoding means for decoding an output signal from said register set control logic means and a first address signal to transfer said input data signal to said data register means;

write data drive means for transferring an output data signal from said data input buffer means or said data register means to a selected one of said memory cells;

first data transfer means for transferring the output data signal from said data input buffer means to said write data drive means;

second data transfer means for transferring the output data signal from said data register means to said write data drive means;

data transfer control means for generating first and second control signals to control said first and second data transfer means, respectively; and data register output control means for decoding the second control signal from said data transfer control means and a second address signal to transfer the output data signal from said data register means to said write data drive means through said second data transfer means.

2. A semiconductor memory device as set forth in claim 1, wherein said data register means includes:

a plurality of latch means each for temporarily storing said input data signal transferred by said first switching means therein;

a plurality of second switching means each for transferring said input data signal transferred by said first switching means to a corresponding one of said latch means; and a plurality of third switching means each for transferring said input data signal stored in a corresponding one of said latch means to said second data transfer means.

3. A semiconductor memory device as set forth in claim 2, wherein each of said second and third switching means includes a MOS transistor.

4. A semiconductor memory device as set forth in claim 3, wherein said MOS transistor is of an N type.

5. A semiconductor memory device as set forth in claim 2, wherein each of said latch means includes a plurality of inverters.

6. A semiconductor memory device as set forth in claim 1, wherein said first switching means include a MOS transistor.

7. A semiconductor memory device as set forth in claim 6, wherein said MOS transistor is of an N type.

8. A semiconductor memory device as set forth in claim 1, wherein said first data transfer means include a MOS transistor.

9. A semiconductor memory device as set forth in claim 8, wherein said MOS transistor is of an N type.

10. A semiconductor memory device as set forth in claim 1, wherein said second data transfer means include a MOS transistor.

11. A semiconductor memory device as set forth in claim 10, wherein said MOS transistor is of an N type.

12. A semiconductor memory device as set forth in any one of claim 1, wherein said register set control logic means is adapted to turn on said first switching means when a column address strobe bar signal is first enabled and a row address strobe bar signal and a write enable signal are then enabled simultaneously.

13. A semiconductor memory device as set forth in any one of claim 1, wherein said data transfer control means is adapted to turn on said first data transfer means when a desired address signal has a first logic value under the condition that a column address strobe bar signal, a row address strobe bar signal and a write enable signal are all enabled and to turn on said second data transfer means when said desired address signal has a second logic value under the condition that said column address strobe bar signal, row address strobe bar signal and write enable signal are all enabled.

14. A semiconductor memory device as set forth in claim 13, wherein said first logic value is high and said second logic value is low.

* * * * *